US 12,500,066 B2

(12) United States Patent
Martinez et al.

(10) Patent No.: US 12,500,066 B2
(45) Date of Patent: Dec. 16, 2025

(54) NON-INVASIVE IED ESTIMATION FOR PULSED-DC AND LOW FREQUENCY APPLICATIONS

(71) Applicant: MKS Inc., Andover, MA (US)

(72) Inventors: Linnell Martinez, Lakeland, FL (US); David Miller, Rochester, NY (US); Aaron Radomski, Conesus, NY (US)

(73) Assignee: MKS Inc., Andover, MA (US)

( * ) Notice: Subject to any disclaimer, the term of this patent is extended or adjusted under 35 U.S.C. 154(b) by 60 days.

(21) Appl. No.: 18/158,164

(22) Filed: Jan. 23, 2023

(65) Prior Publication Data

US 2024/0249914 A1  Jul. 25, 2024

(51) Int. Cl.
*H01J 37/00* (2006.01)
*H01J 37/32* (2006.01)

(52) U.S. Cl.
CPC .. *H01J 37/32128* (2013.01); *H01J 37/32091* (2013.01); *H01J 37/321* (2013.01)

(58) Field of Classification Search
CPC ............... H01J 37/321; H01J 37/32091; H01J 37/32128
See application file for complete search history.

(56) References Cited

U.S. PATENT DOCUMENTS

| | | | |
|---|---|---|---|
| 6,201,208 B1 | 3/2001 | Wendt et al. | |
| 7,602,127 B2 | 10/2009 | Coumou | |
| 8,110,991 B2 | 2/2012 | Coumou | |
| 8,395,322 B2 | 3/2013 | Coumou | |
| 10,049,857 B2 | 8/2018 | Fisk, II et al. | |
| 10,448,495 B1* | 10/2019 | Dorf | C23C 16/505 |
| 10,546,724 B2 | 1/2020 | Radomski et al. | |
| 10,821,542 B2 | 11/2020 | Nelson et al. | |
| 2004/0112536 A1 | 6/2004 | Quon | |
| 2008/0190893 A1 | 8/2008 | Mori et al. | |
| 2020/0051785 A1* | 2/2020 | Miller | H03K 3/57 |
| 2022/0157561 A1 | 5/2022 | Cui et al. | |

(Continued)

FOREIGN PATENT DOCUMENTS

| | | |
|---|---|---|
| KR | 100782370 B1 | 12/2007 |
| TW | I271124 B | 1/2002 |
| TW | 202221756 A | 6/2022 |

(Continued)

OTHER PUBLICATIONS

U.S. Appl. No. 17/715,672, Martinez, Linnell.

(Continued)

*Primary Examiner* — Tuan T Lam
(74) *Attorney, Agent, or Firm* — Kurt M. Eaton

(57) ABSTRACT

A RF power generation system includes a power source configured to generate a periodic waveform applied to a load and a controller configured to receive at least one of a voltage signal or a current signal indicating a respective voltage and current applied to an electrode of the load. The controller determines a surface potential of a workpiece in the load in accordance with the at least one of the voltage signal or the current signal and a series capacitance of the electrode. The controller further determines an ion potential in accordance with an approximation of the surface potential. The periodic waveform may be one of a pulsed DC waveform, a RF waveform, or a pulsed RF waveform.

37 Claims, 7 Drawing Sheets

(56) References Cited

U.S. PATENT DOCUMENTS

2022/0336222 A1* 10/2022 Zhou ................. H01L 21/31144

FOREIGN PATENT DOCUMENTS

| TW | 202236354 A | 9/2022 |
| WO | WO-2013016619 A1 | 1/2013 |
| WO | 2021231035 A1 | 11/2021 |
| WO | 2022240651 A1 | 11/2022 |

OTHER PUBLICATIONS

International Search Report and Written Opinion of the ISA issued in PCT/US2024/010706, mailed May 9, 2024; ISA/US.
Taiwanese Office Action regarding Patent Application No. 113101599, dated Feb. 10, 2025.

* cited by examiner

NON-INVASIVE IED ESTIMATION FOR PULSED-DC AND LOW FREQUENCY APPLICATIONS

FIELD

The present disclosure relates to RF generator systems and to control of RF generators.

BACKGROUND

Plasma processing is frequently used in semiconductor fabrication. In plasma processing, ions are accelerated by an electric field to etch material from or deposit material onto a surface of a substrate. In one basic implementation, the electric field is generated based on Radio Frequency (RF) or Direct Current (DC) power signals generated by a respective RF or DC generator of a power delivery system. The power signals generated by the generator must be precisely controlled to effectively execute plasma etching.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. One general aspect includes a RF power generation system. The RF power generation system also includes a power source configured to generate a periodic waveform applied to a load. The system also includes a controller configured to: receive at least one of a voltage signal or a current signal indicating a respective voltage and current applied to an electrode of the load; determine a surface potential of a workpiece in the load in accordance with the at least one of the voltage signal or the current signal and a series capacitance of the electrode; and determine an ion potential in accordance with the surface potential. Also in the system, the periodic waveform is one of a non-sinusoidal waveform, a RF waveform, or a pulsed RF waveform. Other embodiments of this aspect include corresponding computer systems, apparatus, and computer programs recorded on one or more computer storage devices, each configured to perform the actions of the methods.

Implementations may include one or more of the following features. The RF power generation system where the electrode is represented as a series capacitance between the power source and the surface potential. The RF power generation system may include a derivative module configured to receive the voltage signal and generating a derivative of the voltage signal. The RF power generation system may include a voltage generation module configured to receive the current signal and a series capacitance of the electrode and generating a determined voltage signal in accordance with the current signal and the series capacitance. The RF power generation system may include a derivative module configured to receive the voltage signal and generating a derivative of the voltage signal. The RF power generation system may include an integration module configured to receive the derivative of the voltage signal and the determined voltage signal and generate an integral of the voltage signal and the determined voltage signal. At least one of the voltage signal or the current signal is received from a sensor that precedes a matching network, or at least one of the voltage signal or the current signal is received from a sensor that follows the matching network. The at least one of the voltage signal or the current signal received from a sensor that precedes a matching network is processed to remove components of the voltage signal or the current signal introduced by the matching network. The RF power generation system may include a high frequency power source configured to generate a high frequency periodic waveform applied to the load. The power source is configured to generate the periodic waveform at a frequency of less than 5 Mhz. The power source is a bias power source of the load, and the load is configured to generate a plasma. The power source is configured to generate the periodic waveform in a time period less than or equal to an ion transit time of a plasma sheath contained by the load. The power source includes a lower frequency power source configured to generate a lower periodic waveform at a lower frequency and a higher frequency power source configured to generate a higher periodic waveform at a higher frequency, and the lower periodic waveform and the higher periodic waveform are combined to output the periodic waveform applied to the load. Implementations of the described techniques may include hardware, a method or process, or computer software on a computer-accessible medium.

One general aspect includes a control system for a power source configured to generate a periodic waveform applied to a load. The control system also includes a derivative module configured to receive a voltage signal that varies in accordance with a sensed voltage at the load, the derivative module generating a voltage derivative signal. The system also includes a voltage generation module configured to receive a current signal that varies in accordance with a sensed current at the load and a series capacitance of an electrode that supports a workpiece in the load, the voltage generation module generating a determined voltage signal in accordance with the current signal and the series capacitance. The system also includes an integration module configured to receive the voltage derivative signal and the determined voltage signal and to generate an integral of the voltage derivative signal and the determined voltage signal. Also in the system, a surface potential of a workpiece in the load varies in accordance with the sensed voltage, the sensed current, and the series capacitance of the electrode, and where an ion potential of a plasma sheath contained by the load varies in accordance with the surface potential. Other embodiments of this aspect include corresponding computer systems, apparatus, and computer programs recorded on one or more computer storage devices, each configured to perform the actions of the methods.

Implementations may include one or more of the following features. The control system where the periodic waveform is one of a non-sinusoidal waveform, a RF waveform, or a pulsed RF waveform. At least one of the voltage signal or the current signal is received from a sensor that precedes a matching network, or at least one of the voltage signal or the current signal is received from a sensor that follows the matching network. The at least one of the voltage signal or the current signal received from a sensor that precedes a matching network is processed to remove components of the voltage signal or the current signal introduced by the matching network. The high frequency is greater than the frequency of the periodic waveform. The power source is configured to generate the periodic waveform at a frequency of less than 5 Mhz. The power source is a bias power source of the load, and the load is configured to generate a plasma. The power source is configured to generate the periodic waveform in a time period less than or equal to an ion transit time of a plasma sheath contained by the load. The power source includes a lower frequency power source configured to generate a lower periodic waveform at a lower frequency and a higher frequency power source configured to generate a higher periodic waveform at a higher frequency, and the lower periodic waveform and the higher periodic waveform are combined to output the periodic waveform applied to the load. Implementations of the described techniques may include hardware, a method or process, or computer software on a computer-accessible medium.

One general aspect includes a non-transitory computer-readable medium storing instructions. The non-transitory computer-readable medium storing instructions also includes generating a periodic waveform applied to a load. The instructions also include receiving at least one of a voltage signal or a current signal indicating a respective voltage and current applied to the load. The instructions also include determining a surface potential of a workpiece in the load in accordance with the at least one of the voltage signal or the current signal and a series capacitance of the electrode. The instructions also include determining an ion potential in accordance with an approximation from the surface potential. Other embodiments of this aspect include corresponding computer systems, apparatus, and computer programs recorded on one or more computer storage devices, each configured to perform the actions of the methods.

Implementations may include one or more of the following features. The non-transitory computer-readable medium storing instructions where the periodic waveform is one of a non-sinusoidal waveform, a RF waveform, or a pulsed RF waveform. The electrode is represented as a series capacitance between a power source generating the periodic waveform and the surface potential. The non-transitory computer-readable medium storing instructions the instructions may include receiving the voltage signal and generating a derivative of the voltage signal. At least one of the voltage signal or the current signal is received from a sensor that precedes a matching network, or at least one of the voltage signal or the current signal is received from a sensor that follows the matching network. The at least one of the voltage signal or the current signal received from a sensor that precedes a matching network is processed to remove components of the voltage signal or the current signal introduced by the matching network. The non-transitory computer-readable medium storing instructions the instructions may include receiving the current signal and a series capacitance of the electrode and generating a determined voltage signal in accordance with the current signal and the series capacitance of the electrode. The non-transitory computer-readable medium storing instructions the instructions may include receiving the voltage signal and generating a derivative of the voltage signal. The non-transitory computer-readable medium storing instructions the instructions may include receiving the derivative of the voltage signal and the determined voltage signal and generate an integral of the derivative of the voltage signal and the determined voltage signal. The non-transitory computer-readable medium storing instructions may include a high frequency power source configured to generate a high frequency periodic waveform applied to the load. The non-transitory computer-readable medium storing instructions the instructions may include generating the periodic waveform at a frequency of less than 5 Mhz. A power source generates the periodic waveform and is a bias power source applying power to the load, and the load is configured to generate a plasma. The non-transitory computer-readable medium storing instructions the instructions may include generating the periodic waveform in a time period less than or equal to an ion transit time of a plasma sheath contained by the load. The non-transitory computer-readable medium storing instructions the instructions may include generating a lower periodic waveform at a lower frequency and a generating a higher periodic waveform at a higher frequency, and the lower periodic waveform and the higher periodic waveform are combined to output the periodic waveform applied to the load. Implementations of the described techniques may include hardware, a method or process, or computer software on a computer-accessible medium.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings.

In the drawings, reference numbers may be reused to identify similar and/or identical elements.

DETAILED DESCRIPTION

Figure 1:
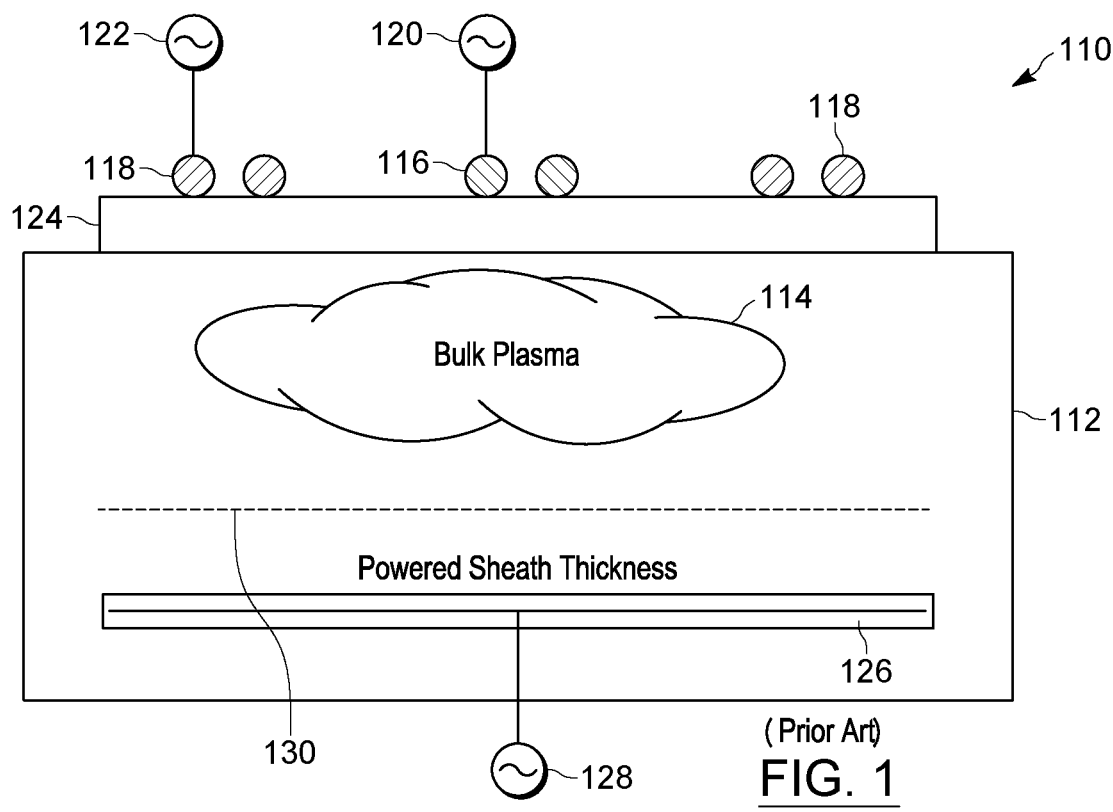
FIG. 1 shows a representation of an inductively coupled plasma processing system.

A power system may include a DC or RF power generator or DC or RF generator, a matching network, and a load (such as a process chamber, a plasma chamber, or a reactor having a fixed or variable impedance). The power generator generates a DC or RF power signal, which is received by the matching network or impedance optimizing controller or circuit. The matching network or impedance optimizing controller or circuit transforms a load impedance to a characteristic impedance of a transmission line between the power generator and the matching network. The impedance matching aids in maximizing an amount of power forwarded to the load ("forward power") and minimizing an amount of power reflected back from the load to the power generator ("reverse power" or "reflected power"). Delivered power to the load may be maximized by minimizing reflected power when the input impedance of the matching network matches the characteristic impedance of the transmission line and generator.

In the power source or power supply field, there are typically two approaches to applying a power signal to the load. A first, more traditional approach is to apply a continuous power signal to the load. In a continuous mode or continuous wave mode, a continuous power signal is typically a constant DC or sinusoidal RF power signal that is output continuously by the power source to the load. In the continuous mode approach, the power signal assumes a constant DC or sinusoidal output, and the amplitude of the power signal and/or frequency (of a RF power signal) can be varied in order to vary the output power applied to the load.

A second approach to applying the power signal to the load involves pulsing a RF signal, rather than applying a continuous RF signal to the load. In a pulse or pulsed mode of operation, a RF signal is modulated by a modulation signal in order to define an envelope for the modulated power signal. The RF signal may be, for example, a sinusoidal RF signal or other time varying signal. Power delivered to the load is typically varied by varying the modulation signal.

In a typical power supply configuration, output power applied to the load is determined by using sensors that measure the forward and reflected power or the voltage and current of the RF signal applied to the load. Either set of these signals is analyzed in a control loop. The analysis typically determines a power value which is used to adjust the output of the power supply in order to vary the power applied to the load. In a power delivery system where the load is a process chamber or other non-linear or time varying load, the varying impedance of the load causes a corresponding varying of power applied to the load, as applied power is in part a function of the impedance of the load.

In systems where fabrication of various devices relies upon introduction of power to a load to control a fabrication process, power is typically delivered in one of two configurations. In a first configuration, the power is capacitively coupled to the load. Such systems are referred to as capacitively coupled plasma (CCP) systems. In a second configuration, the power is inductively coupled to the load. Such systems are typically referred to as inductively coupled plasma (ICP) systems. Power coupling to the plasma can also be achieved via wave coupling at microwave frequencies. Such an approach typically uses Electron Cyclotron Resonance (ECR) or microwave sources. Helicon sources are another form of wave coupled sources and typically operate at RF frequencies similar to that of conventional ICP and CCP systems. Power delivery systems may include at least one bias power and/or a source power applied to one or a plurality of electrodes of the load. The source power typically generates a plasma and controls plasma density, and the bias power modulates ions in the formulation of the sheath. The bias and the source may share the same electrode or may use separate electrodes, in accordance with various design considerations.

When a power delivery system drives a time-varying or non-linear load, such as a process chamber or plasma chamber, the power absorbed by the bulk plasma and plasma sheath results in a density of ions with a range of ion energy. One characteristic measure of ion energy is the ion energy distribution function (IEDF). The ion energy distribution function (IEDF) can be controlled with the bias power. One way of controlling the IEDF for a system in which multiple RF power signals are applied to the load occurs by varying multiple RF signals that are related by at least one of amplitude, frequency, and phase. The related at least one of amplitude, frequency, and phase of multiple RF power signals may also be related by a Fourier series and the associated coefficients. The frequencies between the multiple RF power signals may be locked, and the relative phase between the multiple RF signals may also be locked. Examples of such systems can be found with reference to U.S. Pat. Nos. 7,602,127; 8,110,991; and 8,395,322, all assigned to the assignee of the present application and incorporated by reference in this application.

Time varying or non-linear loads may be present in various applications. In one application, plasma processing systems may also include components for plasma generation and control. One such component is a non-linear load implemented as a process chamber, such as a plasma chamber or reactor. A typical plasma chamber or reactor utilized in plasma processing systems, such as by way of example, for thin-film manufacturing, can utilize a dual power system. One power generator (the source) controls the generation of the plasma, and the other power generator (the bias) controls ion energy. Examples of dual power systems include systems that are described in U.S. Pat. Nos. 7,602,127; 8,110,991; and 8,395,322, referenced above. The dual power system described in the above-referenced patents employs a closed-loop control system to adapt power supply operation for the purpose of controlling ion density and its corresponding ion energy distribution function (IEDF).

Multiple approaches exist for controlling a process chamber, such as may be used for generating plasmas. For example, in RF power delivery systems, phase and frequency of multiple driving RF signals operating at the same or nearly the same frequency may be used to control plasma generation. For RF driven plasma sources, the periodic waveform affecting plasma sheath dynamics and the corresponding ion energy are generally known and are controlled by the frequency of the periodic waveforms and the associated phase interaction. Another approach in RF power delivery systems involves dual frequency control. That is, two RF frequency sources operating at different frequencies are used to power a plasma chamber to provide substantially independent control of ion and electron densities.

Another approach utilizes wideband RF power sources to drive a plasma chamber. A wideband approach presents certain challenges. One challenge is coupling the power to the electrode. A second challenge is that the transfer function of the generated waveform to the actual sheath voltage for a desired IEDF must be formulated for a wide process space to support material surface interaction. In one responsive approach in an inductively coupled plasma system, controlling power applied to a source electrode controls the plasma density while controlling power applied to the bias electrode modulates ions to control the IEDF to provide etch rate and etch feature profile control. By using source electrode and bias electrode control, the etch rate and other various etch characteristics are controlled via the ion density and energy.

As integrated circuit and device fabrication continues to evolve, so do the power requirements for controlling the process for fabrication. For example, with memory device fabrication, the requirements for bias power continue to increase. Increased power generates higher and more energetic ions for increased directionality or anisotropic etch feature profiles and faster surface interaction, thereby increasing the etch rate and allowing higher aspect ratio features to be etched. In RF systems, increased ion energy is sometimes accompanied by a lower bias frequency requirement along with an increase in the power and number of bias power sources coupled to the plasma sheath created in the plasma chamber. The increased power at a lower bias frequency and the increased number of bias power sources results in intermodulation distortion (IMD) from a sheath modulation. The IMD emissions can significantly reduce power delivered by the source where plasma generation occurs. U.S. Pat. No. 10,821,542, issued Nov. 3, 2020, entitled Pulse Synchronization by Monitoring Power in Another Frequency Band, assigned to the assignee of the present application, and incorporated by reference herein, describes a method of pulse synchronization by monitoring power in another frequency band. In the referenced U.S. patent application, the pulsing of a second RF generator is controlled in accordance with detecting at the second RF generator the pulsing of a first RF generator, thereby synchronizing pulsing between the two RF generators.

Prior methods to calculate or estimate the ion energy distribution are described in U.S. patent application Ser. No. 17/715,672, filed Apr. 7, 2022, entitled Real-Time, Non-Invasive IEDF Plasma Sensor, assigned to the assignee of the present application, and incorporated by reference herein. The systems and methods described therein require significant computational power and an accurate electrical representation of the plasma reactor, its parasitics, and its various sheaths. The requirements make the systems and methods described therein challenging to implement in a production system. Thus, the system and methods described therein have limited applicability to use during fabrication so that the process may be adjusted in real-time.

FIG. 1 depicts a representation of an inductively coupled plasma (ICP) system 110. ICP system 110 includes a non-linear load, such as a reactor, plasma reactor, or plasma chamber 112, which will be referred to interchangeably herein, for generating plasma 114. Power in the form of voltage or current is applied to plasma chamber 112 via a pair of coils, including a coil assembly that in various configurations includes one or multiple coils arranged in various configurations. In one nonlimiting arrangement shown in FIG. 1, plasma chamber 112 includes one or both a first coil 116 and a second coil 118. In various configurations, multiple coils may be arranged concentrically, intertwined, or in a spiral configuration. Power is applied to first coil 116 via RF power generator or power source 120, and power is applied to second coil 118 via RF power generator or power source 122. Coils 116 and 118 are arranged to provide power to plasma chamber 112. A dielectric window 124 enables power to couple through to the plasma while providing a vacuum seal. A substrate is placed in plasma chamber 112 and typically forms the work piece that is the subject of plasma operations. An RF power generator, power supply, or power source 128 (the terms may be used herein interchangeably) applies power to plasma chamber 112 via substrate.

In various configurations, power sources 120, 122 provide a source voltage or current to ignite or generate plasma 114 or control the plasma density. Also in various configurations, power source 128 provides a bias voltage or current that modulates the ions to control the ion potential or ion energy of the plasma 114. In various configurations, power sources 120, 122 are locked to operate at the same frequency, voltage, and current, with fixed or varying relative phases. In various other configurations, power sources 120, 122 may operate at different frequencies, voltages, and currents, and relative phases.

Figure 2:
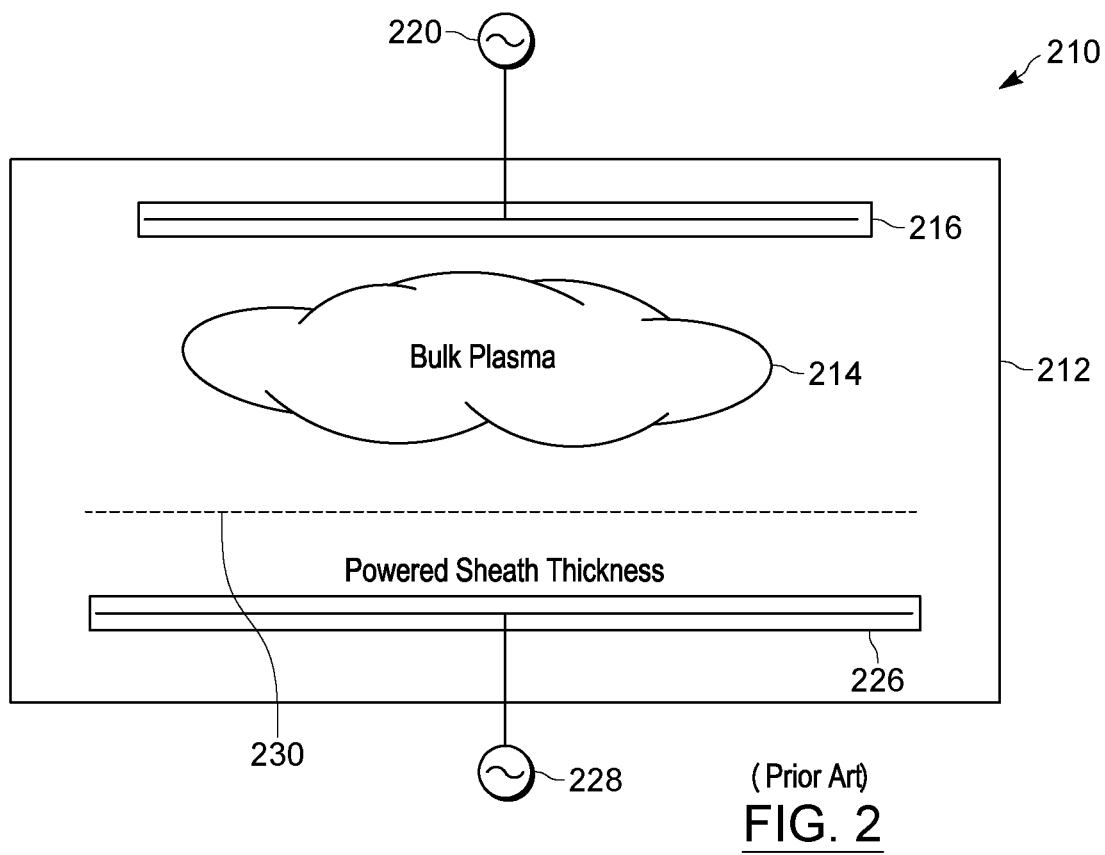
FIG. 2 shows a representation of a capacitively coupled plasma processing system.

FIG. 2 depicts a representation of a capacitively coupled plasma (CCP) system 210. CCP system 210 includes plasma chamber 212 for generating plasma 214. A pair of electrodes 216, 226 placed within plasma chamber 212 connect to respective DC ($\omega=0$) or RF power generators or power sources 220, 228. In various configurations, power source 220 provides a source voltage or current to ignite or generate plasma 214 or control the plasma density, although a bias power source may also be used to ignite a plasma. In various configurations, power source 228 provides a bias voltage or current that modulates the ions in the plasma to control ion potential, ion energy, or ion density of the plasma 214. In various CCP configurations, bias power and source power may be applied to the upper electrode, such as electrode 216, and the lower electrode, such as electrode 226, in various combinations. In another nonlimiting example, bias power and source power may be applied to a lower electrode, such as electrode 226, and the top electrode, such as electrode 216, is grounded or floating. In various RF configurations, power sources 220, 228 operate at relative phases when the sources are harmonically related. In various other configurations, power sources 220, 228 operate at different frequencies, voltages, and currents, with fixed or varying relative phases. Also in various configurations, power sources 220, 228 can be connected to the same electrode, while the counter electrode is connected to ground or to yet a third DC ($\omega=0$) or RF power generator (not shown). In addition to a sinusoidal bias waveform, in various configurations, a non-sinusoidal bias waveform may control ion energy. By way of non-limiting example, the bias waveform may be a pulsed rectangular waveform or a piecewise linear waveform as described in U.S. Pat. No. 10,396,601, issued on Aug. 27, 2019, entitled Piecewise RF Power Systems and Methods for Supplying Pre-Distorted RF Bias Voltage Signals to an Electrode in a Processing Chamber, assigned to the assignee of the present application, and incorporated by reference herein.

FIGS. 1 and 2 each show a conventional single bias electrode system in which respective bias electrodes 126, 226 are configured as a single electrode, as compared to multiple electrodes. In conventional single bias electrode systems, plasma 114, 214 may form as a bulk plasma. Each bulk plasma results in a plasma sheath 130, 230 contained by respective loads or plasma chambers 112, 212.

Figure 3:
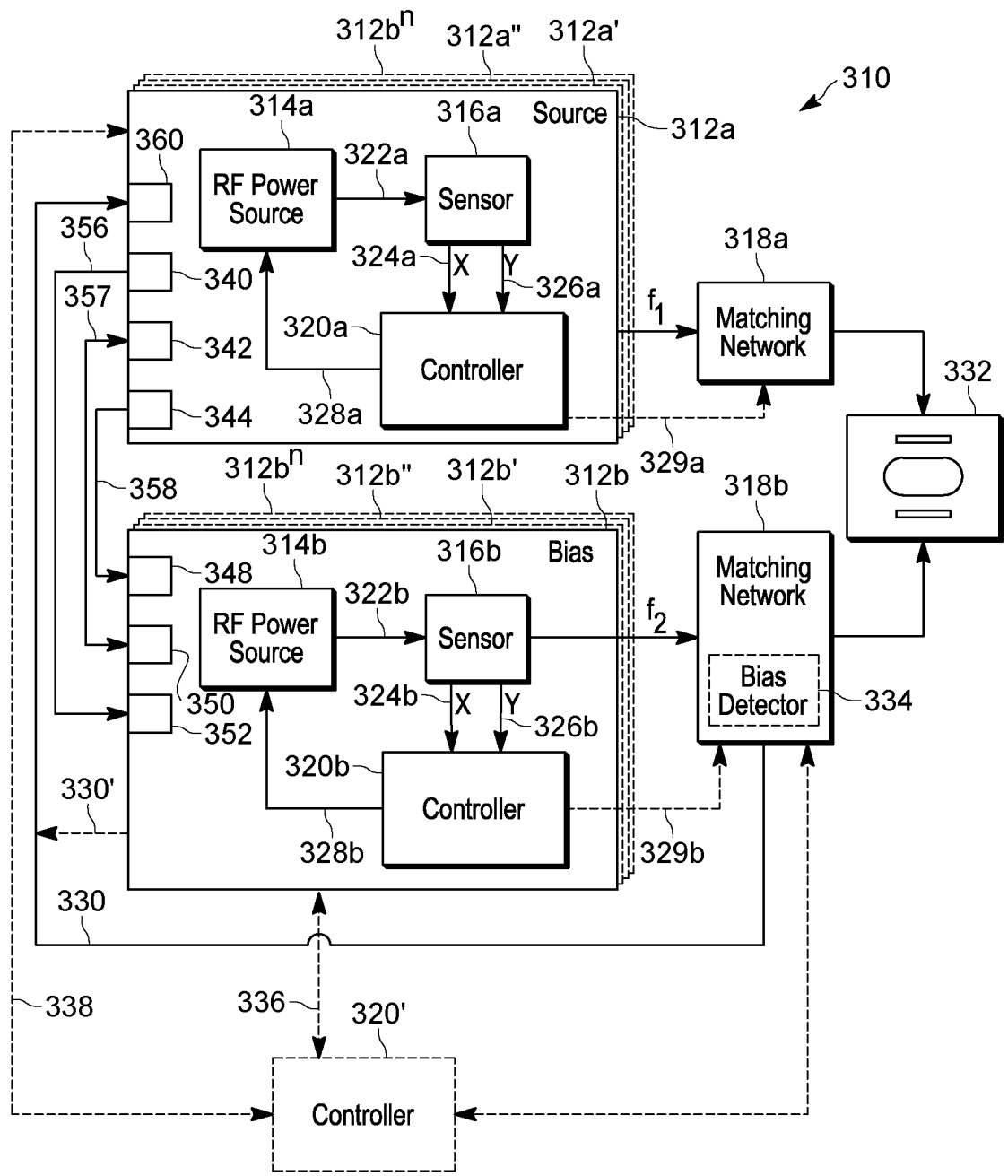
FIG. 3 is a schematic block diagram of a power delivery system having multiple power supplies arranged according to various configurations of the present disclosure.

FIG. 3 depicts a RF generator or power supply system 310. Power supply system 310 includes a pair of radio frequency (RF) generators or power supplies 312a, 312b, matching networks 318a, 318b, and load 332, such as a non-linear load, which may be a plasma chamber, plasma reactor, process chamber, and the like. In various configurations, RF generator 312a is referred to as a source RF generator or power supply, and matching network 318a is referred to as a source matching network. Also in various configurations, RF generator 312b is referred to as a bias RF generator or power supply, and matching network 318b is referred to as a bias matching network. It will be understood that components can be referenced individually or collectively using the reference number with or without a letter subscript or a prime symbol. In various configurations, one or both of matching networks 318a, 318b may be implemented as a RF blocking filter, rather than an impedance match, such as may be the case for a matching network receiving a pulsed DC or non-sinusoidal signal. In various other configurations, one or both of matching networks 318a, 318b may be omitted.

In various configurations, source RF generator 312a receives a control signal 330 from matching network 318b, generator 312b, or a control signal 330' from bias RF generator 312b. Synchronization or trigger signals 330 or 330' represent an input signal to source RF generator 312a that indicates one or more operating characteristics or parameters of bias RF generator 312b. In various configurations, a synchronization bias detector 334 senses the RF signal output from matching network 318b to load 332 and outputs synchronization or trigger signal 330 to source RF generator 312a. In various configurations, synchronization or trigger signal 330' may be output from bias RF generator 312b to source RF generator 312a, rather than trigger signal 330. A difference between trigger or synchronization signals 330, 330' may result from the effect of matching network 318b, which can adjust the phase between the input signal to and output signal from matching network. Signals 330, 330' include information about the operation of bias RF generator 312b that in various configurations enables predictive responsiveness to address periodic fluctuations in the impedance of plasma chamber 332 caused by the bias RF generator 312b. When control signals 330 or 330' are absent, RF generators 312a, 312b operate autonomously.

RF generators 312a, 312b include respective RF power sources or amplifiers 314a, 314b, sensors 316a, 316b, and processors, controllers, or control modules 320a, 320b. RF power sources 314a, 314b generate respective RF power signals 322a, 322b output to respective sensors 316a, 316b. RF power signals 322a, 322b pass through sensors 316a, 316b and are provided to matching networks 318a, 318b as respective RF power signals $f_1$ and $f_2$. Sensors 316a, 316b output signals that vary in accordance with various parameters sensed from load 332. While sensors 316a, 316b, are shown within respective RF generators 312a, 312b, sensors 316a, 316b can be located externally to RF generators 312a, 312b. Such external sensing can occur at the output of the RF generator, at the input of an impedance matching device located between the RF generator and the load, or between the output of the impedance matching device (including within the impedance matching device) and the load.

Sensors 316a, 316b detect various operating parameters and output signals X and Y. Sensors 316a, 316b may include voltage, current, and/or directional coupler sensors. Sensors 316a, 316b may detect (i) voltage V and current I and/or (ii) forward power $P_{FWD}$ output from respective power amplifiers 314a, 314b and/or RF generators 312a, 312b and reverse or reflected power $P_{REV}$ received from respective matching networks 318a, 318b or load 332 connected to respective sensors 316a, 316b. The voltage V, current I, forward power $P_{FWD}$, and reverse power $P_{REV}$ may be scaled, filtered, or scaled and filtered versions of the actual voltage, current, forward power, and reverse power associated with the respective power sources 314a, 314b. Sensors 316a, 316b may be analog or digital sensors or a combination thereof. In a digital implementation, the sensors 316a, 316b may include analog-to-digital (A/D) converters and signal sampling components with corresponding sampling rates. Signals X and Y can represent any of the voltage V and current I or forward (or source) power $P_{FWP}$ reverse (or reflected) power $P_{REV}$.

Sensors 316a, 316b generate sensor signals X, Y, which are received by respective controllers or control modules 320a, 320b. Control modules 320a, 320b process the respective X, Y signals 324a, 326a and 324b, 326b and generate one or a plurality of feedforward or feedback control signals 328a, 328b to respective power sources 314a, 314b. Power sources 314a, 314b adjust RF power signals 322a, 322b based on the received one or plurality feedback or feedforward control signal. In various configurations, power control modules 320a, 320b may control matching networks 318a, 318b, respectively, via respective control signals 329a, 329b based on, for example, X, Y signals 324a, 326a and 324b, 326b. Power control modules 320a, 320b may include one or more proportional-integral (PI), proportional-integral-derivative (PID), linear-quadratic-regulator (LQR) controllers or subsets thereof and/or direct digital synthesis (DDS) component(s) and/or any of the various components described below in connection with the modules.

In various configurations, power control modules 320a, 320b may include functions, processes, processors, or submodules. Control signals 328a, 328b may be control or actuator drive signals and may communicate DC offset or rail voltage, voltage or current magnitude, frequency, and phase components, etc. In various configurations, feedback control signals 328a, 328b can be used as inputs to one or multiple control loops. In various configurations, the multiple control loops can include a proportional-integral (PI), proportional-integral-derivative (PID) controllers, linear-quadratic-regulator (LQR) control loops, or subsets thereof, for RF drive, and for rail voltage. In various configurations, control signals 328a, 328b can be used in one or both of a single-input-single-output (SISO) or multiple-input-multiple-output (MIMO) control scheme. An example of a MIMO control scheme can be found with reference to U.S. Pat. No. 10,546,724, issued on Jan. 28, 2020, entitled Pulsed Bidirectional Radio Frequency Source/Load, assigned to the assignee of the present application, and incorporated by reference herein. In other configurations, signals 328a, 328b can provide feedforward control as described in U.S. Pat. No. 10,049,857, issued Aug. 14, 2018, entitled Adaptive Periodic Waveform Controller, assigned to the assignee of the present application, and incorporated by reference herein.

In various configurations, power supply system 310 can include controller 320'. Controller 320' may be disposed externally to either or both of RF generators 312a, 312b and may be referred to as external or common controller 320'. In various configurations, controller 320' may implement one or a plurality of functions, processes, or algorithms described herein with respect to one or both of controllers 320a, 320b. Accordingly, controller 320' communicates with respective RF generators 312a, 312b via a pair of respective links 336, 338 which enable exchange of data and control signals, as appropriate, between controller 320' and RF generators 312a, 312b. For the various configurations, controllers 320a, 320b, 320' can distributively and cooperatively provide analysis and control of RF generators 312a, 312b. In various other configurations, controller 320' can provide control of RF generators 312a, 312b, eliminating the need for the respective local controllers 320a, 320b.

In various configurations, RF power source 314a, sensor 316a, controller 320a, and matching network 318a can be referred to as source RF power source 314a, source sensor 316a, source controller 320a, and source matching network 318a, respectively. Similarly in various configurations, RF power source 314b, sensor 316b, controller 320b, and matching network 318b can be referred to as bias RF power source 314b, bias sensor 316b, bias controller 320b, and bias matching network 318b, respectively. In various configurations and as described above, the source term refers to the RF generator that generates a plasma, and the bias term refers to the RF generator that tunes ion potential and the Ion Energy Distribution Function (IEDF) of the plasma. In various configurations, the source and bias RF power supplies operate at different frequencies. In various configurations, the source RF power supply operates at a higher frequency than the bias RF power supply. In various other configurations, the source and bias RF power supplies operate at the same frequencies or substantially the same frequencies.

According to various configurations, source RF generator 312a and bias RF generator 312b include multiple ports to communicate externally. Source RF generator 312a includes pulse synchronization output port 340, digital communication port 342, RF output port 344, and control signal port 360. Bias RF generator 312b includes RF input port 348, digital communication port 350, and pulse synchronization input port 352. Pulse synchronization output port 340 outputs a pulse synchronization signal 356 to pulse synchronization input port 352 of bias RF generator 312b. Digital communication port 342 of source RF generator 312a and digital communication port 350 of bias RF generator 312b communicate via a digital communication link 357. Control signal port 360 of source RF generator 312a receives one or both of control signals 330, 330'. RF output port 344 generates a RF control signal 358 input to RF input port 348. In various configurations, RF control signal 358 is substantially the same as the RF control signal controlling source RF generator 312a. In various other configurations, RF control signal 358 is the same as the RF control signal controlling source RF generator 312a, but is phase shifted within source RF generator 312a in accordance with a requested phase shift generated by bias RF generator 312b. Thus, in various configurations, source RF generator 312a and bias RF generator 412b are driven by substantially identical RF control signals or by substantially identical RF control signal phase shifted by a predetermined amount.

In various configurations, power supply system 310 may include multiple RF source generators 312a and multiple RF bias generators 312b. By way of nonlimiting example, a plurality of source RF generators 312a, 312a', 312a", . . . , 312a" can be arranged to provide a plurality of output power signals to one or more source electrodes of load 332. Similarly, a plurality of bias RF generators 312b, 312b', 312b", . . . , 312b" may provide a plurality of output power signals to a plurality of bias electrodes of load 332. When source RF generator 312a and bias RF generator 312b are configured to include a plurality of respective source RF generators or bias RF generators, each RF generator will output a separate signal to a corresponding plurality of matching networks 318a, 318b, configured to operate as described above, in a one-to-one correspondence. In various other configurations, there may not be a one-to-one correspondence between each RF generator and matching network. In various configurations, multiple source electrodes may refer to multiple electrodes that cooperate to define a composite source electrode. Similarly, multiple bias electrodes may refer to multiple connections to multiple electrodes that cooperate to define a composite bias electrode.

Figure 4:
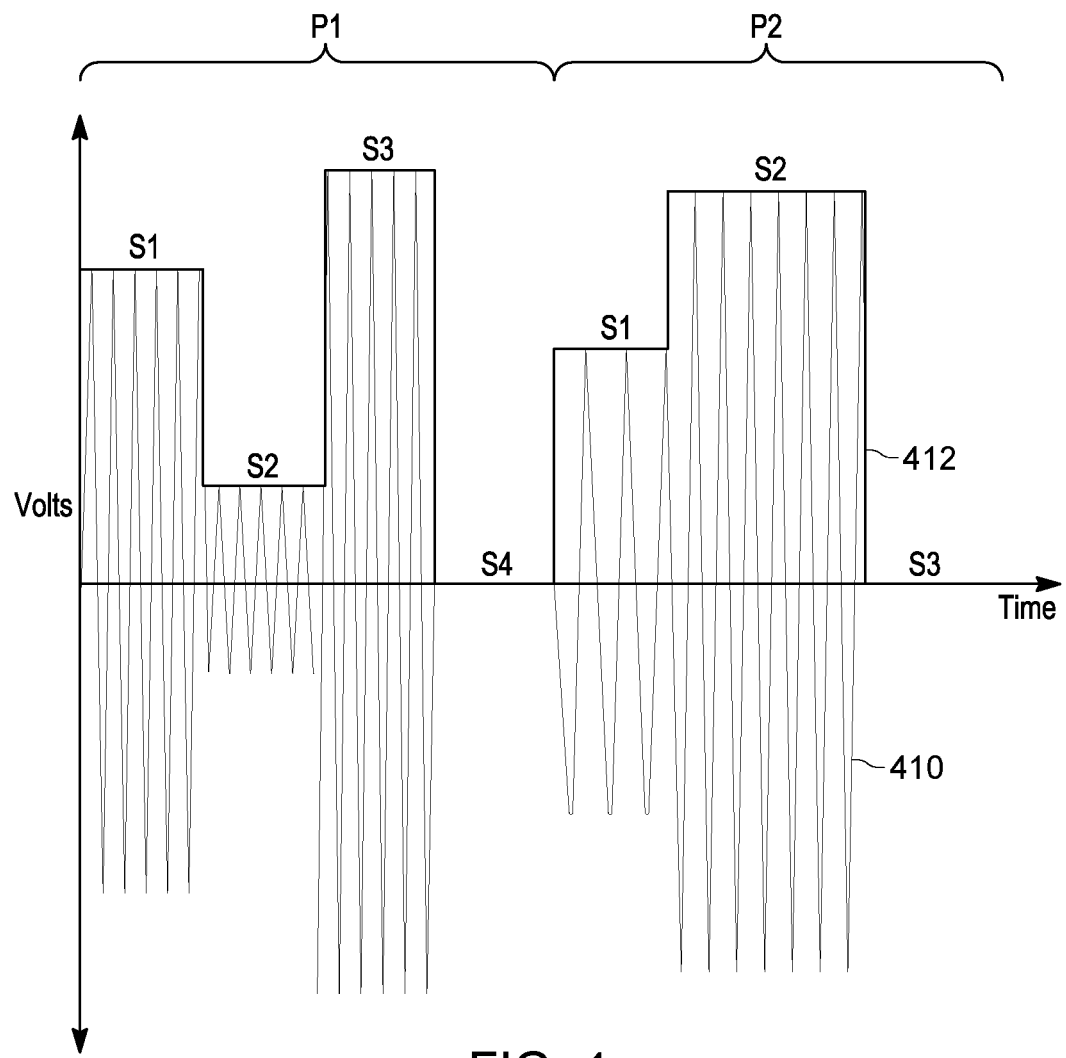
FIG. 4 shows waveforms of a RF signal and a pulse modulating the RF signal to describe a pulse mode of operation.

FIG. 4 depicts a plot of voltage versus time to describe a pulse or pulsed mode of operation for delivering power to a load, such as load 332 of FIG. 3. More particularly, FIG. 4 depicts two-multistate pulses P1, P2 of a pulse signal 412 having a respective plurality of states S1-S4 and S1-S3. In FIG. 4, RF signal 410 is modulated by pulses P1 and P2. As shown at states S1-S3 of P1 and S1-S2 of P2, when the pulses are ON, RF generator 312 outputs RF signal 410 having an amplitude defined by the pulse magnitude at each state. Conversely, during states S4 of P1 and S3 of P2, the pulses are OFF, and RF generator 312 does not output RF signal 410. Pulses P1, P2 can repeat at a constant duty cycle or a variable duty cycle, and states S1-S4, S1-S3 of each respective pulse P1, P2 may have the same or varying amplitudes and widths.

In various configurations, RF signal 410 need not be a implemented as a sinusoidal waveform as shown in FIG. 4. As referenced above with respect to FIG. 2, in addition to a sinusoidal waveform, in various configurations, signal 410 may be a non-sinusoidal waveform. By way of non-limiting example, the waveform 410 may be a rectangular waveform pulsed in a repeated or intermittent manner or a piecewise linear waveform as described in U.S. Pat. No. 10,396,601. In various configurations, pulse signal 412 may be other than a square wave as shown in FIG. 4. Further, by way of non-limiting example, an envelope or pulse signal 412 may be a rectangular, trapezoidal, triangular, sawtooth, gaussian, or other shape that defines an envelope or modulating envelope of the underlying, modulated RF signal. In various configurations, the pulse signal may occur or reoccur within fixed or variable periods or time periods. In various other configurations, the pulse signal may vary in shape between each occurrence. In various other configurations, the pulse signal may occur or reoccur within fixed or variable time periods and vary in shape between each occurrence. Further yet, pulses P1, P2 can have multiple states S1, . . . , Sn of varying amplitude, duration, and shape. States S1, . . . , Sn may repeat within fixed or variable periods and may include all or a portion of the various shapes described above. Also shown in FIG. 4, RF signal 410 may operate at frequencies that vary between states or within a state.

Figure 5:
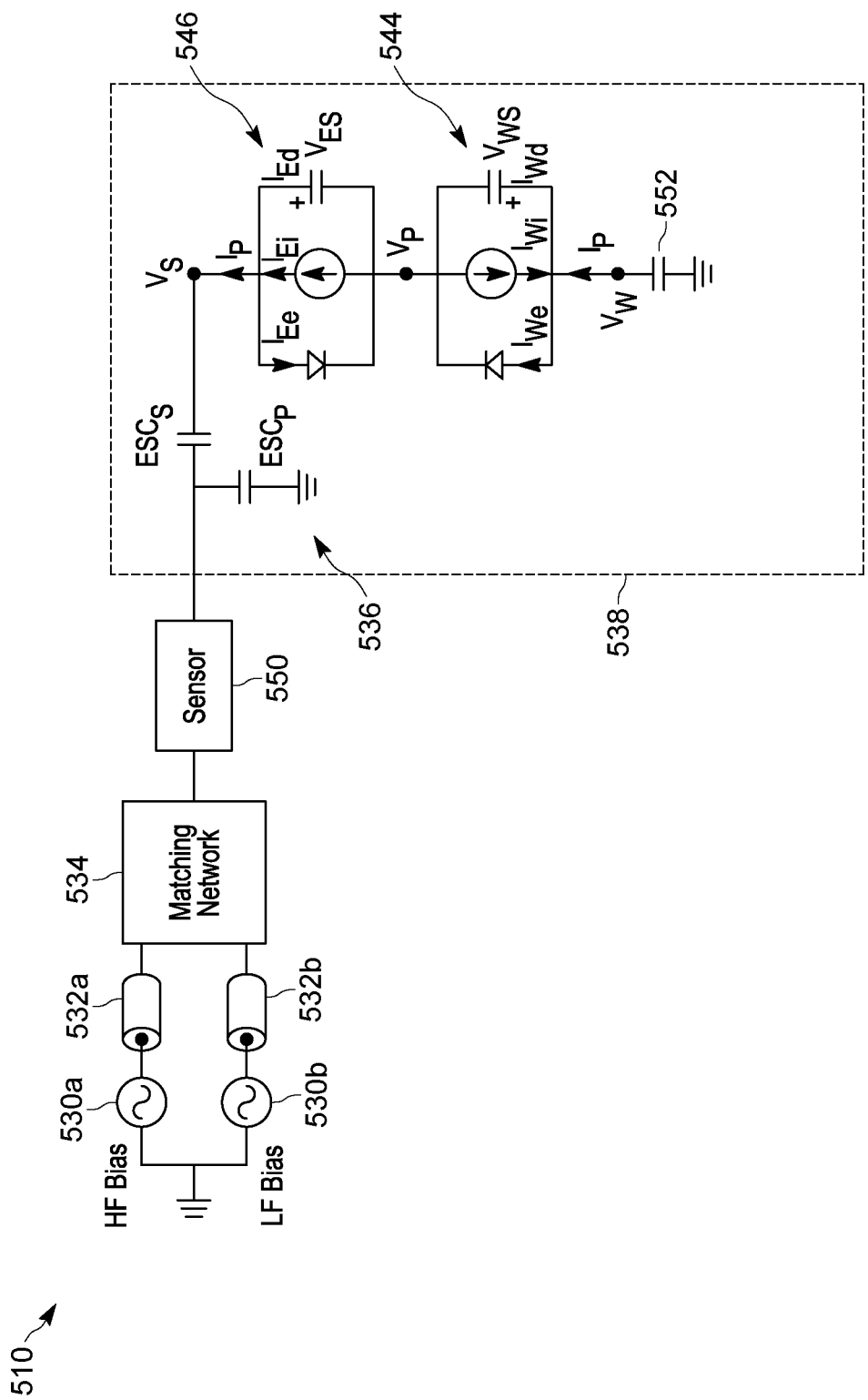
FIG. 5 is a schematic block diagram of a power supply powering a load.

FIG. 5 shows a representation of a portion of a RF plasma generation system 510, such as for a bias portion of a RF power supply system, by way of non-limiting example. The RF plasma generation system 510 includes a pair of RF power generators 530a, 530b, implemented as a pair of bias RF power generators. RF power generator 530a represents a high frequency RF power generator providing high frequency bias power, and RF power generator 530b represents a low frequency RF power generator providing a low frequency bias power. Respective RF power generators 530a, 530b may be operated to provide a desired ion potential and corresponding IED in accordance with various design considerations. Each RF power generator 530a, 530b outputs RF power to respective transmission line 532a, 532b. The output from respective transmission lines 532a, 532b is input to matching network 534.

Matching network 534 combines the respective RF powers and outputs a signal to sensor 550, which may be implemented as any of the sensors described above, including a V/I sensor or a directional coupler. Sensor 550 detects one or a number of preselected parameters at the input to plasma chamber 538, from which an approximation of ion energy of the plasma chamber can be determined as described herein. Sensor 550 outputs one or a plurality of sensed values that vary in accordance with a state of the plasma. The RF powers input to sensor 550 are combined and passed through sensor 550 to electrode 536.

In various configurations, matching network 534 and sensor 550 may be ordered so that sensor 550 precedes matching network 534. In such a configuration, sensor 550 receives and combines the output from RF power generators 530a, 530b and outputs a sensor value or signal in accordance with the combined RF powers received from RF power generators 530a, 530b via respective transmission lines 530a, 530b. Sensor 550 also outputs a power signal to matching network 534 which provides a matching function and outputs a matched signal to electrode 536. In such a configuration, the preselected parameters detected by sensor 550 represent sensed values or signals. The sensed values or signals may be processed to remove the component portions of the signal introduced by the matching network 534.

In various configurations, electrode 536 may be implemented as an electrostatic chuck (ESC) or an electrode keyed to a supported workpiece. Electrode 536 may be referred to herein as electrode, electrostatic chuck, or ESC. In various configurations, electrode or electrostatic chuck may be represented as a pair of capacitors, including series capacitor $ESC_s$ and parallel capacitor $ESC_p$. Series capacitor $ESC_s$ connects to powered or electrode sheath, represented as powered or electrode sheath 546. The potential on the surface of the ESC, shown at the node connecting electrostatic chuck 536 and powered or electrode sheath 546, is indicated as $V_S$.

Powered or electrode sheath 546 connects to wall sheath 544, and the node between powered or electrode sheath 546 and wall sheath 544 is represented as plasma potential $V_P$. Wall sheath 544 also connects to ground via capacitor 552 at a node having a wall potential $V_W$. In various configurations, capacitor 552 may be omitted, which implies that the reactor has electrically conductive walls and are in contact with the plasma. The current flowing through powered or electrode sheath 546, wall sheath 544, and capacitor 552 is indicated as $I_P$.

While FIG. 5 shows a pair of sheath voltages or sheath potentials, it should be recognized that an electrical representation can be constructed with one or more sheath potentials. A greater number of sheath potentials in the electrical representation may improve accuracy of the electrical representation but will require additional computational overhead.

In various configurations, the IED may be estimated using selected electrical parameters for characterizing the system. In various configurations, at driving frequencies less than or close to the ion sheath transit time, ions can cross the sheath during one waveform period at nearly the full magnitude of the waveform. Thus, the ion potential can follow the sheath potential waveform. In other words, it can be inferred that ions traversing the collision-less sheath gain energy approximately equivalent to the magnitude of the sheath potential waveform. The ion potential at the surface of the electrode, which is also the ion potential at the substrate or work piece, has a similar character and magnitude to the sheath potential, but with an offset. In other words, the time derivative of the surface potential and the sheath potential are essentially equivalent. The ion potential differs from the conventional RF driving waveform typically measured at the input to the chamber. The ion potential is a hypothetical potential calculated to represent the energy ions gain as they cross the sheath and to facilitate the generation of an ion energy distribution. Alternative methods to measure the ion energy require invasive measurement hardware, which is not typically available or desired in production plasma reactors. As described herein, however, the parameters measured by sensor 550, such as the voltage waveform and current waveform can be used to determine the ion potential.

Given that most production plasma processing equipment uses an electrode implemented as an ESC to clamp the substrate, and the ESC has a fixed series capacitance, the potential on its surface can be determined using the voltage and current relationship of a capacitor in series with the powered sheath. In various configurations, the series capacitance may be characterized prior to or during the production process. Described below is a mathematical description and a block diagram of such an implementation.

Current $I_M(t)$ at the input to plasma chamber or reactor 538 is defined in Equation (1):

$$I_M(t) = C_{ESC}\frac{dV_{ESC}(t)}{dt} \quad (1)$$

where:

$C_{ESC}$ is the series capacitance of the electrostatic chuck; and $$\frac{dV_{ESC}(t)}{dt}$$

is the derivative of voltage with respect to time across the electrostatic chuck and is defined in Equation (2):

$$\frac{dV_{ESC}(t)}{dt} = \frac{dV_S(t)}{dt} - \frac{dV_M(t)}{dt} \quad (2)$$

where:

$$\frac{dV_S(t)}{dt}$$

is the derivative of voltage with respect to time at a terminal of the ESC as shown in FIG. 5; and $$\frac{dV_M(t)}{dt}$$

is the derivative of voltage with respect to time at the input to plasma chamber or reactor 538.

By rebalancing Equation (1), $$\frac{dV_{ESC}(t)}{dt}$$

can be rewritten as shown in Equation (3):

$$\frac{dV_{ESC}(t)}{dt} = \frac{I_M(t)}{C_{ESC}} \quad (3)$$

Substituting Equation (3) into Equation (2) and rebalancing $$\frac{dV_S(t)}{dt}$$

can be represented as shown in Equation (4):

$$\frac{dV_S(t)}{dt} = \frac{I_M(t)}{C_{ESC}} + \frac{dV_M(t)}{dt} \quad (4)$$

Surface potential $V_S(t)$ can be estimated by integrating $$\frac{dV_S(t)}{dt}$$

as shown in Equation (4). The integral is shown below in Equation (5):

$$V_S(T) \cong \int \frac{dV_S(t)}{dt} = \int \left( \frac{I_M(t)}{C_{ESC}} + \frac{dV_M(t)}{dt} \right) \quad (5)$$

Figure 6:
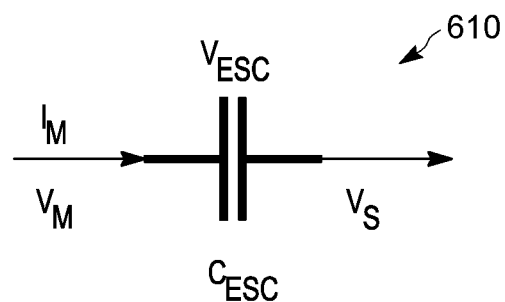
FIG. 6 is an electrical representation of an electrode of a load.

With reference to FIG. 6, an electrical representation of electrode 610 shows an ESC having a voltage $V_{ESC}$ across electrode 610 and capacitance $C_{ESC}$. The voltage $V_M$ and current $I_M$ input to reactor 538 are applied to electrode 610. Ion potential $V_{ION}(t)$ can be approximated in accordance with surface potential $V_S$ of the electrode 610, as shown in Equation (6):

$$V_{ION} \cong V_S \quad (6)$$

Thus, surface potential $V_S$ is used to approximate ion potential $V_{ION}$ of ions crossing the plasma sheath. In various configurations, the IED estimation approach described herein is particularly applicable where the output of power supplies 530a, 530b is in an operating range of DC to 5 MHz. Surface potential $V_S$ varies in accordance with the sheath potential $V_{SH}$, and the IED varies in accordance with ion potential $V_{ION}$, which is approximated from surface potential $V_S$.

Figure 7:
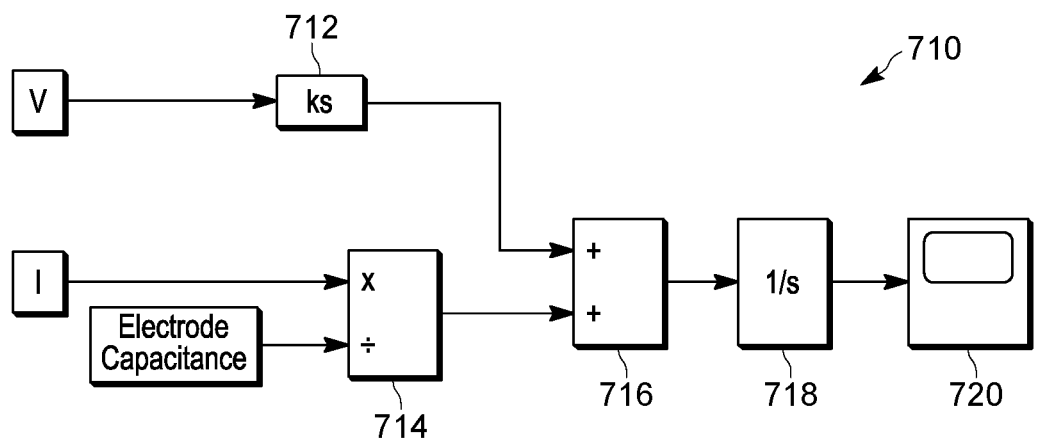
FIG. 7 is a block diagram of a module for determining surface potential of an electrode of a load.

FIG. 7 shows a block diagram 710 of one approach to determining surface potential $V_s$ as described above. With reference to FIG. 7, voltage signal $V_M(t)$ is input to derivative module 712, which applies a constant and determines a derivative of the input voltage, such as $dV_M(t)/dt$. Current signal $I_M(t)$ and electrode capacitance $C_{ESC}$ are input to divider or voltage generation module 714. Divider or voltage generation module 714 generates a determined voltage signal that varies in accordance with the quotient of current signal $I_M(t)$ and electrode capacitance $C_{ESC}$. Derivative module 712 and divider or voltage generation module 714 output respective derivative and quotient values or signals to combiner module 716. Combiner module 716 combines the outputs from derivative module 712 and divider or voltage generation module 714. Combiner module 716 outputs the combined value or signal to integrator 718. Integrator 718 integrates the combined value or signal and outputs an integrated value or signal, sheath potential $V_s$. Ion potential $V_{ION}$ is approximated from surface potential $V_s$ and is input to controller 720 which controls various system parameters in accordance with ion potential $V_{ION}$. In various configurations, the respective voltage signal $V_M(t)$ and current signal $I_M(t)$ values or signals may be output by sensor 550 of FIG. 5, where sensor 550 either precedes matching network 534 or follows matching network 534, as described above with respect to FIG. 5.

Figure 8:
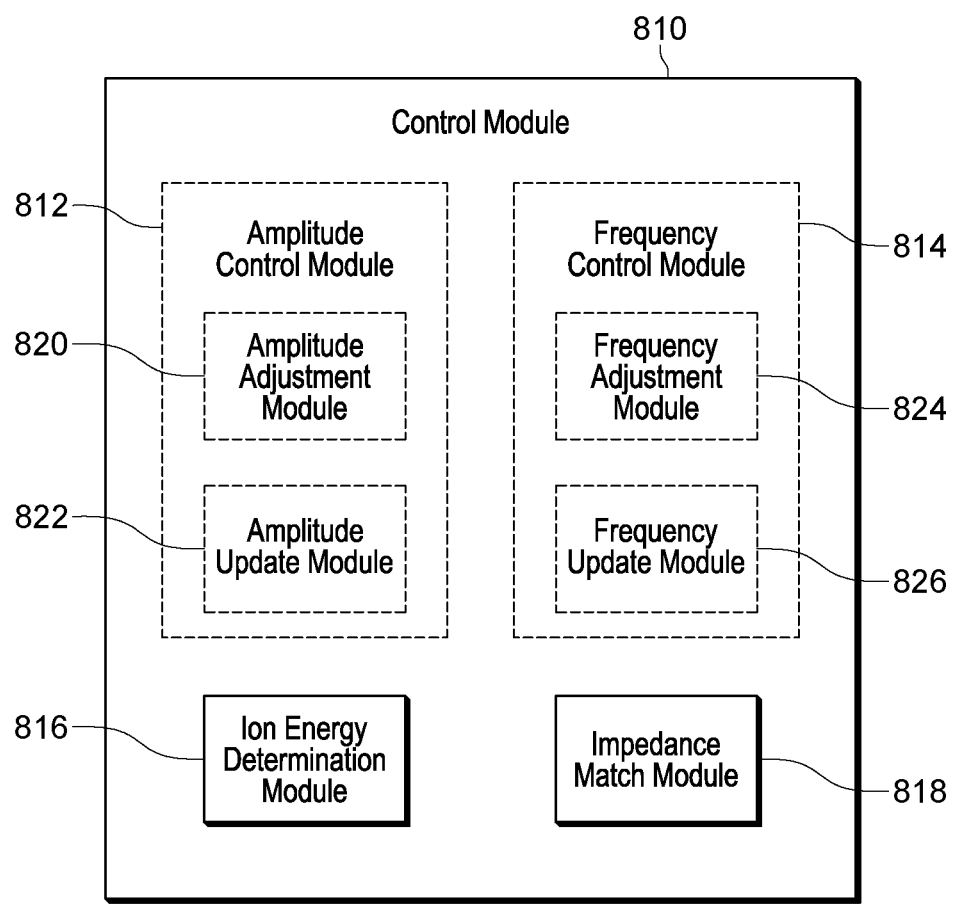
FIG. 8 shows a functional block diagram of an example control module arranged in accordance with various configurations.

FIG. 8 incorporates various components of FIGS. 1-7. Control module 810 may include amplitude control module 812, frequency control module 814, ion energy determination module 816, and impedance match module 818. Amplitude control module 812 includes amplitude adjustment module 820 and amplitude update module 822. Similarly, frequency control module 814 includes frequency adjustment module 824 and frequency update module 826. In various configurations, control module 810 includes one or a plurality of processors that execute code associated with the module sections or modules 810, 812, 814, 816, 818, 820, 822, 824, and 826. Operation of the module sections or modules 810, 812, 814, 816, 818, 820, 822, 824, and 826 is described below with respect to the method of FIG. 9.

For further defined structure of controllers 320a, 320b, and 320' of FIG. 3, see the below provided flow chart of FIG. 9 and the below provided definition for the term "module". The systems disclosed herein may be operated using numerous methods, examples, and various control system methods of which are illustrated in FIG. 3. Although the following operations are primarily described with respect to the implementations of FIG. 3, the operations may be easily modified to apply to other implementations of the present disclosure. The operations may be iteratively performed. Although the following operations are shown and primarily described as being performed sequentially, one or more of the following operations may be performed while one or more of the other operations are being performed.

Figure 9:
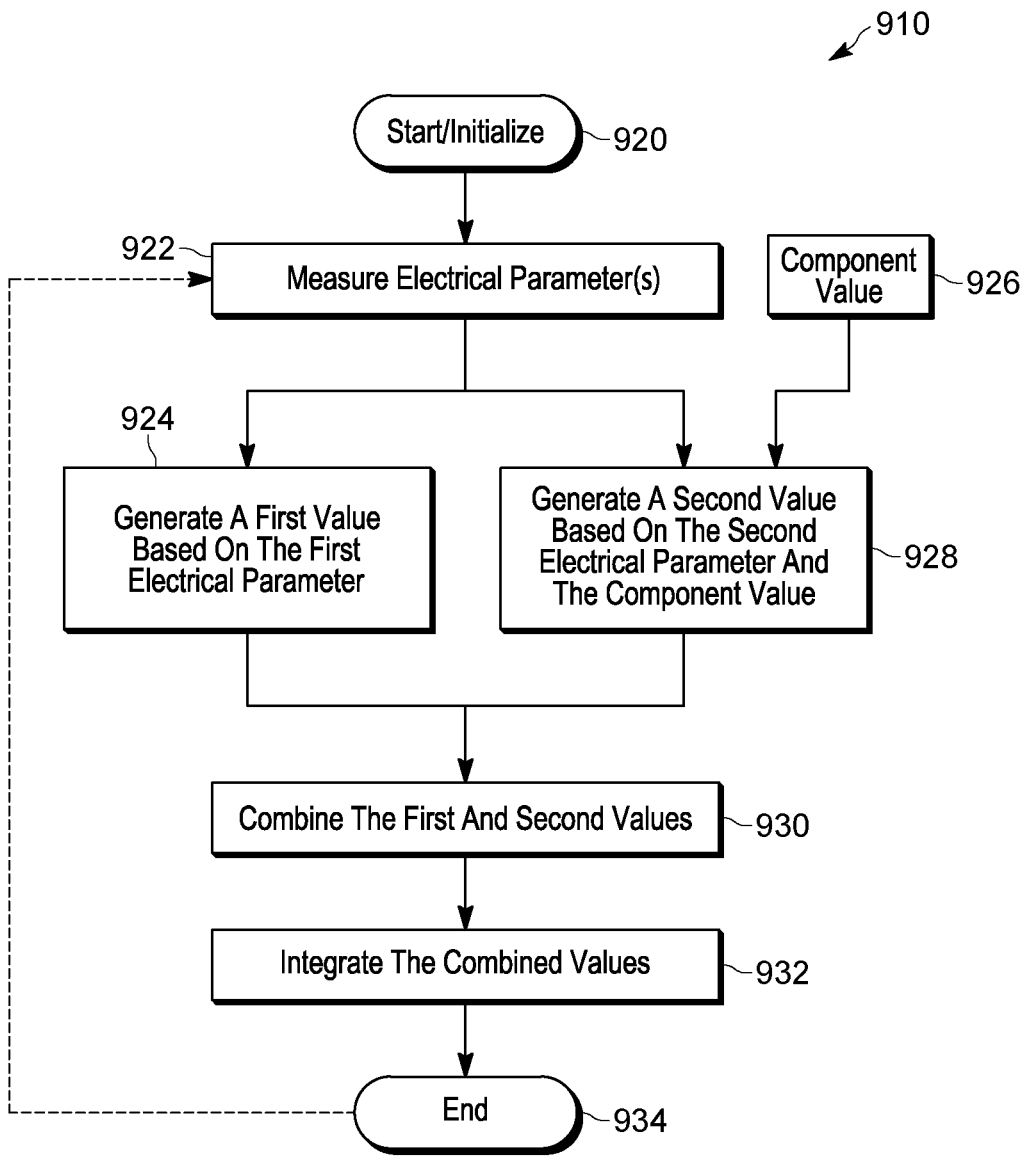
FIG. 9 shows a flow chart of operation of a control system arranged in accordance with the principals of the present disclosure.

FIG. 9 shows a flow chart of a control system 910 for performing control of, for example, the power delivery systems of FIG. 3. Control begins at block 920 and proceeds to block 922. At block 922, one or more electrical parameters are measured, such as voltage and current input to reactor 538. The one or more electrical parameters are output to respective blocks 924, 928. In various configurations, a first electrical parameter, such as voltage input to reactor 538, is input to block 924. At block 924 a first value or signal is generated based on the first electrical parameter. In various configurations, the first value or signal may be a derivative of the first electrical parameter, such as a derivative of the voltage input to reactor 538.

In various configurations, a second electrical parameter, such as current input to reactor 538, is input to block 928. Block 928 also receives a component value 926, such as the capacitance of electrode 610. At block 928 a second value is generated based on the second electrical parameter and the component value. In various configurations, the second value may be a quotient of the component value and the second electrical parameter.

In various configurations, the first value and the second value are output from respective blocks 924, 928 and are input to block 930. At block 930, the first and second values are combined, and the combined value is output to block 932. At block 932, the combined value is integrated in order to determine the surface potential $V_S$ of the electrode 536. As described above, ion potential $V_{ION}$ is approximated from surface potential $V_S$. The process ends at block 934, or can return to block 922.

The IED estimation method proposed in the present disclosure provides IEDF control over a predetermined operating range of lower RF frequencies, such as for bias RF generators. The system and methods described herein utilize the chamber electrode or electrostatic chuck capacitance and the sampling voltage and current at the chamber input, typically at the chamber electrode or electrostatic chuck. The sampling occurs with reasonable accuracy and at an appropriate rate. With this information, a signal which represents an estimate of the ion energy can be derived with minimal calculations.

CONCLUSION

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. In the written description and claims, one or more steps within a method may be executed in a different order (or concurrently) without altering the principles of the present disclosure. Similarly, one or more instructions stored in a non-transitory computer-readable medium may be executed in a different order (or concurrently) without altering the principles of the present disclosure. Unless indicated otherwise, numbering or other labeling of instructions or method steps is done for convenient reference, not to indicate a fixed order.

Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements.

The phrase "at least one of A, B, and C" should be construed to mean a logical (A OR B OR C), using a non-exclusive logical OR, and should not be construed to mean "at least one of A, at least one of B, and at least one of C." The term "set" does not necessarily exclude the empty set—in other words, in some circumstances a "set" may have zero elements. The term "non-empty set" may be used to indicate exclusion of the empty set—in other words, a non-empty set will always have one or more elements. The term "subset" does not necessarily require a proper subset. In other words, a "subset" of a first set may be coextensive with (equal to) the first set. Further, the term "subset" does not necessarily exclude the empty set—in some circumstances a "subset" may have zero elements.

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" can be replaced with the term "controller" or the term "circuit." In this application, the term "controller" can be replaced with the term "module." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); processor hardware (shared, dedicated, or group) that executes code; memory hardware (shared, dedicated, or group) that stores code executed by the processor hardware; other suitable hardware components that provide the described functionality; or a combination of some or all of the above, such as in a system-on-chip.

The module may include one or more interface circuits. In some examples, the interface circuit(s) may implement wired or wireless interfaces that connect to a local area network (LAN) or a wireless personal area network (WPAN). Examples of a LAN are Institute of Electrical and Electronics Engineers (IEEE) Standard 802.11-2020 (also known as the WIFI wireless networking standard) and IEEE Standard 802.3-2018 (also known as the ETHERNET wired networking standard). Examples of a WPAN are IEEE Standard 802.15.4 (including the ZIGBEE standard from the ZigBee Alliance) and, from the Bluetooth Special Interest Group (SIG), the BLUETOOTH wireless networking standard (including Core Specification versions 3.0, 4.0, 4.1, 4.2, 5.0, and 5.1 from the Bluetooth SIG).

The module may communicate with other modules using the interface circuit(s). Although the module may be depicted in the present disclosure as logically communicating directly with other modules, in various implementations the module may actually communicate via a communications system. The communications system includes physical and/or virtual networking equipment such as hubs, switches, routers, and gateways. In some implementations, the communications system connects to or traverses a wide area network (WAN) such as the Internet. For example, the communications system may include multiple LANs connected to each other over the Internet or point-to-point leased lines using technologies including Multiprotocol Label Switching (MPLS) and virtual private networks (VPNs).

In various implementations, the functionality of the module may be distributed among multiple modules that are connected via the communications system. For example, multiple modules may implement the same functionality distributed by a load balancing system. In a further example, the functionality of the module may be split between a server (also known as remote, or cloud) module and a client (or, user) module. For example, the client module may include a native or web application executing on a client device and in network communication with the server module.

Some or all hardware features of a module may be defined using a language for hardware description, such as IEEE Standard 1364-2005 (commonly called "Verilog") and IEEE Standard 1076-2008 (commonly called "VHDL"). The hardware description language may be used to manufacture and/or program a hardware circuit. In some implementations, some or all features of a module may be defined by a language, such as IEEE 1666-2005 (commonly called "SystemC"), that encompasses both code, as described below, and hardware description.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

The memory hardware may also store data together with or separate from the code. Shared memory hardware encompasses a single memory device that stores some or all code from multiple modules. One example of shared memory hardware may be level 1 cache on or near a microprocessor die, which may store code from multiple modules. Another example of shared memory hardware may be persistent storage, such as a solid state drive (SSD), which may store code from multiple modules. Group memory hardware encompasses a memory device that, in combination with other memory devices, stores some or all code from one or more modules. One example of group memory hardware is a storage area network (SAN), which may store code of a particular module across multiple physical devices. Another example of group memory hardware is random access memory of each of a set of servers that, in combination, store code of a particular module.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of a non-transitory computer-readable medium are nonvolatile memory devices (such as a flash memory device, an erasable programmable read-only memory device, or a mask read-only memory device), volatile memory devices (such as a static random access memory device or a dynamic random access memory device), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. Such apparatuses and methods may be described as computerized apparatuses and computerized methods. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective C, Swift, Haskell, Go, SQL, R, Lisp, Java®, Fortran, Perl, Pascal, Curl, OCaml, JavaScript®, HTML5 Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A power generation system, comprising:
    a power source configured to generate a waveform applied to a load; and
    a controller configured to:
        receive at least one of a voltage signal or a current signal indicating a respective voltage and current applied to an electrode of the load;
        determine a surface potential of a workpiece in the load in accordance with the at least one voltage signal or the current signal and a series capacitance of the electrode; and
        determine an ion potential in accordance with the surface potential.

2. The power generation system of claim 1 wherein the electrode is represented as a series capacitance between the power source and the surface potential.

3. The power generation system of claim 1 further comprising a derivative module configured to receive the voltage signal and generating a derivative of the voltage signal.

4. The power generation system of claim 1 further comprising a voltage generation module configured to receive the current signal and a series capacitance of the electrode and generating a determined voltage signal in accordance with the current signal and the series capacitance.

5. The power generation system of claim 1 wherein at least one of the voltage signal or the current signal is received from a sensor that precedes a matching network, or at least one of the voltage signal or the current signal is received from a sensor that follows the matching network.

6. The power generation system of claim 5 wherein the at least one of the voltage signal or the current signal received from a sensor that precedes a matching network is processed to remove components of the voltage signal or the current signal introduced by the matching network.

7. The power generation system of claim 4 further comprising a derivative module configured to receive the voltage signal and generating a derivative of the voltage signal.

8. The power generation system of claim 7 further comprising an integration module configured to receive the derivative of the voltage signal and the determined voltage signal and generate an integral of the voltage signal and the determined voltage signal.

9. The power generation system of claim 1 further comprising a high frequency power source configured to generate a high frequency waveform applied to the load.

10. The power generation system of claim 9 wherein the power source is configured to generate the waveform at a frequency of less than 5 MHz.

11. The power generation system of claim 1 wherein the power source is a bias power source of the load, and the load is configured to generate a plasma.

12. The power generation system of claim 1 wherein the power source is configured to generate the waveform in a time period less than or equal to an ion transit time of a plasma sheath contained by the load.

13. The power generation system of claim 1 wherein the power source includes a lower frequency power source configured to generate a lower waveform at a lower frequency and a higher frequency power source configured to generate a higher waveform at a higher frequency, and the lower waveform and the higher waveform are combined to output the waveform applied to the load.

14. A control system for a power source configured to generate a waveform applied to a load, comprising:
a derivative module configured to receive a voltage signal that varies in accordance with a sensed voltage at the load, the derivative module generating a voltage derivative signal;
a voltage generation module configured to receive a current signal that varies in accordance with a sensed current at the load and a series capacitance of an electrode that supports a workpiece in the load, the voltage generation module generating a determined voltage signal in accordance with the current signal and the series capacitance; and
an integration module configured to receive the voltage derivative signal and the determined voltage signal and to generate an integral of the voltage derivative signal and the determined voltage signal,
wherein a surface potential of a workpiece in the load varies in accordance with the sensed voltage, the sensed current, and the series capacitance of the electrode, and wherein an ion potential of a plasma sheath contained by the load varies in accordance with the surface potential.

15. The control system of claim 14 wherein the waveform is one of a non-sinusoidal waveform, a waveform, or a pulsed waveform.

16. The control system of claim 14 wherein at least one of the voltage signal or the current signal is received from a sensor that precedes a matching network, or at least one of the voltage signal or the current signal is received from a sensor that follows the matching network.

17. The control system of claim 16 wherein the at least one of the voltage signal or the current signal received from a sensor that precedes a matching network is processed to remove components of the voltage signal or the current signal introduced by the matching network.

18. The control system of claim 14 further comprising a high frequency power source configured to generate a high frequency waveform applied to the load, wherein the high frequency is greater than a frequency of the waveform.

19. The control system of claim 18 wherein the power source is configured to generate the waveform at a frequency of less than 5 MHz.

20. The control system of claim 14 wherein the power source is a bias power source of the load, and the load is configured to generate a plasma.

21. The control system of claim 14 wherein the power source is configured to generate the waveform in a time period less than or equal to an ion transit time of a plasma sheath contained by the load.

22. The control system of claim 14 wherein the power source includes a lower frequency power source configured to generate a lower waveform at a lower frequency and a higher frequency power source configured to generate a higher waveform at a higher frequency, and the lower waveform and the higher waveform are combined to output the waveform applied to the load.

23. A non-transitory computer-readable medium storing instructions, the instructions comprising:
generating a waveform applied to a load;
receiving at least one of a voltage signal or a current signal indicating a respective voltage and current applied to the load;
determining a surface potential of a workpiece in the load in accordance with the at least one of a voltage signal or the current signal and a series capacitance of an electrode supporting the workpiece; and
determining an ion potential in accordance with an approximation from the surface potential.

24. The non-transitory computer-readable medium storing instructions of claim 23 wherein the waveform is one of a non-sinusoidal waveform, a sinusoidal waveform, or a pulsed waveform.

25. The non-transitory computer-readable medium storing instructions of claim 23 wherein the electrode is represented as a series capacitance between a power source generating the waveform and the surface potential.

26. The non-transitory computer-readable medium storing instructions of claim 23, the instructions further comprising receiving the voltage signal and generating a derivative of the voltage signal.

27. The non-transitory computer-readable medium storing instructions of claim 23 wherein at least one of the voltage signal or the current signal is received from a sensor that precedes a matching network, or at least one of the voltage signal or the current signal is received from a sensor that follows the matching network.

28. The non-transitory computer-readable medium storing instructions of claim 27 wherein the at least one of the voltage signal or the current signal received from a sensor that precedes a matching network is processed to remove components of the voltage signal or the current signal introduced by the matching network.

29. The non-transitory computer-readable medium storing instructions of claim 23, the instructions further comprising receiving the current signal and a series capacitance of the electrode and generating a determined voltage signal in accordance with the current signal and the series capacitance of the electrode.

30. The non-transitory computer-readable medium storing instructions of claim 29, the instructions further comprising receiving the voltage signal and generating a derivative of the voltage signal.

31. The non-transitory computer-readable medium storing instructions of claim 30, the instructions further comprising receiving the derivative of the voltage signal and the determined voltage signal and generate an integral of the derivative of the voltage signal and the determined voltage signal.

32. The non-transitory computer-readable medium storing instructions of claim 23 further comprising a high frequency power source configured to generate a high frequency waveform applied to the load.

33. The non-transitory computer-readable medium storing instructions of claim 32, the instructions further comprising generating the waveform at a frequency of less than 5 MHz.

34. The non-transitory computer-readable medium storing instructions of claim 23 wherein a power source generates the waveform and is a bias power source applying power to the load, and the load is configured to generate a plasma.

35. The non-transitory computer-readable medium storing instructions of claim 23, the instructions further comprising generating the waveform in a time period less than or equal to an ion transit time of a plasma sheath contained by the load.

36. The non-transitory computer-readable medium storing instructions of claim 23, the instructions further comprising generating a lower waveform at a lower frequency and a generating a higher waveform at a higher frequency, and the lower waveform and the higher waveform are combined to output the waveform applied to the load.

37. The power generation system of claim 1 wherein the waveform is one of a non-sinusoidal waveform, a sinusoidal waveform, or a pulsed waveform.

\* \* \* \* \*